United States Patent [19]
Takeuchi

[11] Patent Number: 5,661,626
[45] Date of Patent: Aug. 26, 1997

[54] EXCESS CURRENT DETECTION AND CONTROL CIRCUIT FOR POWER SOURCE IN SEMICONDUCTOR TEST SYSTEM

[75] Inventor: Hideo Takeuchi, Kazo, Japan

[73] Assignee: Advantest Corporation, Tokyo, Japan

[21] Appl. No.: 532,495

[22] Filed: Sep. 22, 1995

[30] Foreign Application Priority Data

Sep. 22, 1994 [JP] Japan .................................. 6-254358
Feb. 24, 1995 [JP] Japan .................................. 7-061708

[51] Int. Cl.$^6$ .......................... G01R 31/302; H02J 1/00
[52] U.S. Cl. .......................... 361/93; 324/750; 324/764; 307/71; 307/86
[58] Field of Search .......................... 361/93; 324/750, 324/763–769, 771; 323/274–277, 282–285; 307/71, 85–86

[56] References Cited

U.S. PATENT DOCUMENTS 4,637,020  1/1987  Schinabeck .................................. 371/20
5,059,889  10/1991  Heaton .................................. 323/285

Primary Examiner—Jeffrey A. Gaffin
Assistant Examiner—Michael J. Sherry
Attorney, Agent, or Firm—Knobbe, Martens, Olson & Bear, LLP

[57] ABSTRACT

An excess current detection and control circuit for a power source system to provide an overall electric current to a device to be tested, includes: a plurality of device power sources connected in parallel with each other to form the power source system whereby supplying an electric current to the device wherein each of the device power sources is provided with a predetermined excess current level flowing to the device and maintaining the excess current without further increasing the electric current level and generates an excess current detection signal when the electric current reaching the excess current level, a power source condition monitor device connected to the plurality of device power sources for receiving the excess current detection signal from each of the device power sources and generating an interruption signal only when receiving the excess current detection signal from each and all of the device power sources connected to the device to be tested, and a central processor unit for determining whether the overall current flowing through the device under test is larger than a predetermined excess current level of the device under test when receiving the interruption signal from the power source condition monitor device.

3 Claims, 5 Drawing Sheets

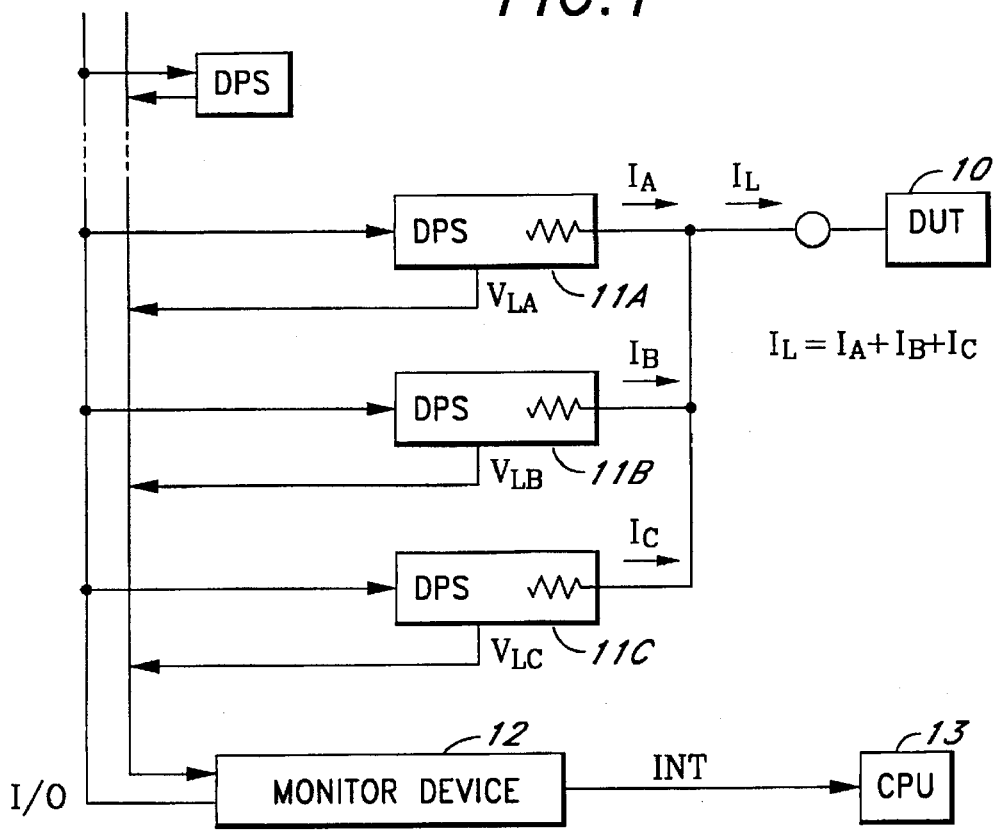

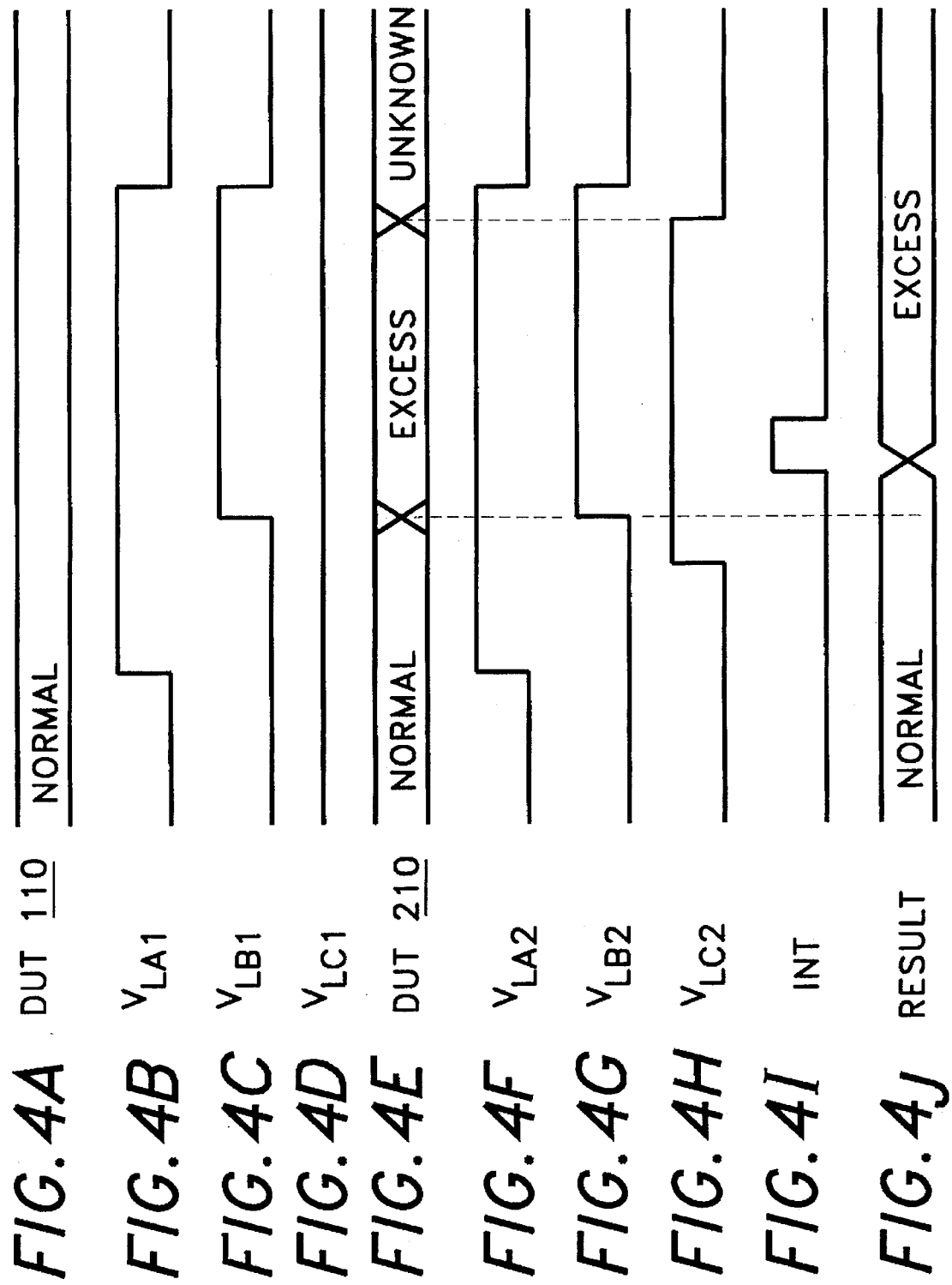

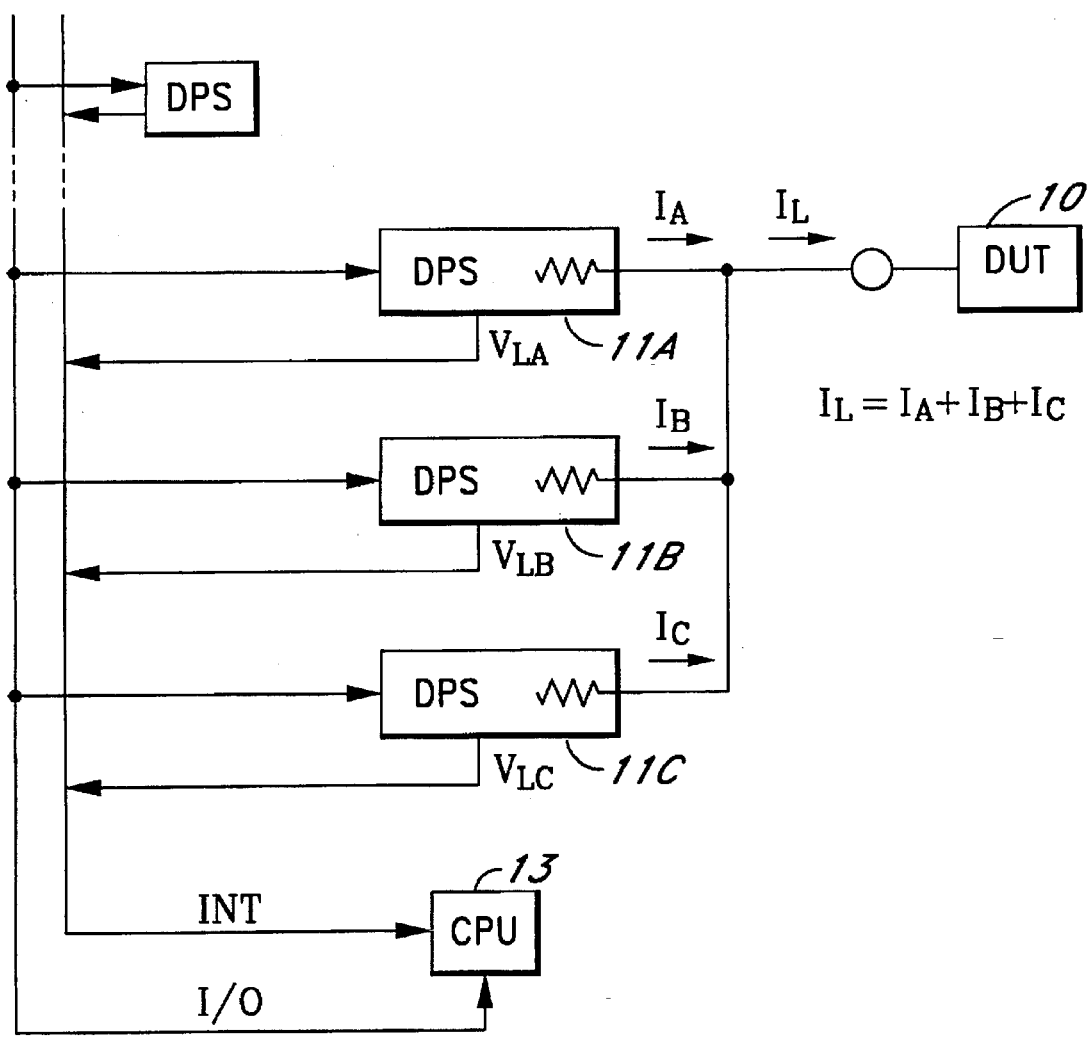

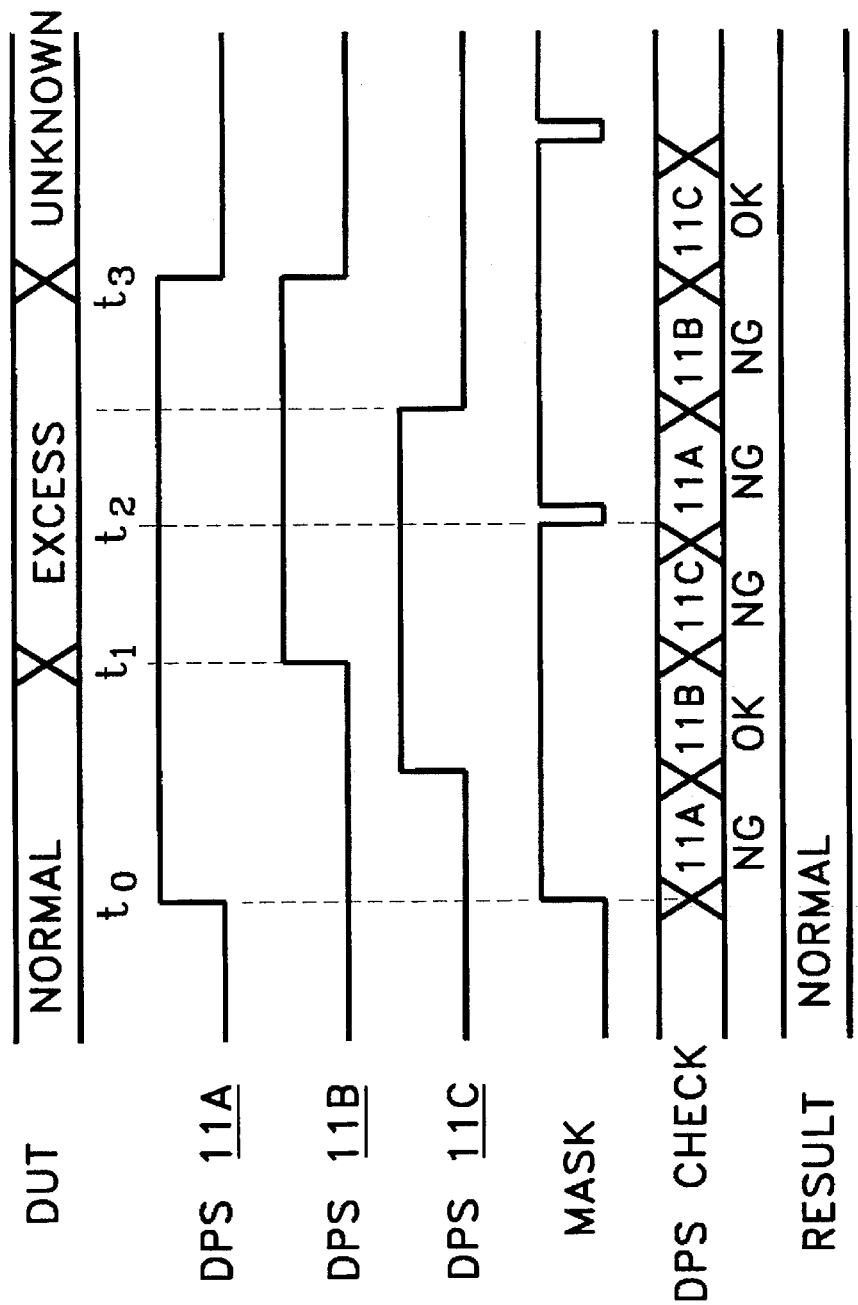

EXCESS CURRENT DETECTION AND CONTROL CIRCUIT FOR POWER SOURCE IN SEMICONDUCTOR TEST SYSTEM

BACKGROUND OF THE INVENTION

The present invention relates to an excess electric current detection and control circuit for electric power source system for supplying an electric power to a semiconductor device to be tested, and in particular, to an excess electric current detection and control circuit for a plurality of power sources working in parallel for supplying a variable electric power to a semiconductor device to be tested by a semiconductor test system.

In testing a semiconductor device by a semiconductor test system, the semiconductor test system has to provide a variable electric power source to the semiconductor device under test to determine whether the device works correctly under the predetermined power level. Thus, the semiconductor test system includes a device power source (DPS) to achieve an electric current setting function to freely provide different levels of electric power to the device under test. If, for example, the device under test drains an electric current which is deemed to be excessive, the device may be determined to be defective.

When an electric current which is excessive to the device under test flows, because for example, the device under test is defective, an excess electric current detect signal is generated and a predetermined electric current (maximum current level) is maintained to be provided to the device until the test system determines that the device under test has failed in the test. Therefore, in case that one electric power source for a device under test 10 which drains a more source current than specified, the electric power source generates an excess electric current detection signal. The detection signal is proceeded to a central processing unit 13 which initiates an interrupt procedure to determine whether there exist any problems in this source power level test. By this procedure, it is conceived that excess electric current is applied to the device 10 and thus the power level test for the device 10 is deemed to be defective.

In practice, in order to increase the amount of electric power that can be provided to a device under test, the electric power source in the semiconductor test system is formed with a plurality of device power sources-connected in a parallel fashion. FIG. 5 shows an example of power source having a plurality of device power sources DPSs to be used for a semiconductor test system. In this example, three DPSs 11A, 11B and 11C are connected in parallel to supply a sum of electric currents the three DPSs to the device 10 that is to be tested.

When an excess electric current of DUT 10 is set to $I_{Lmax}$, corresponding excess electric currents $I_{Amax}$, $I_{Bmax}$ and $I_{Cmax}$ are respectively set in the DPSs 11A, 11B and 11C so as to satisfy $I_{Lmax}=I_{Amax}+I_{Bmax}+I_{Cmax}$. As shown in FIG. 5, when the amount of the current to the DUT has not reached the excess electric current, the electric current $I_L$ to be provided to DUT should be $I_L=I_A+I_B+I_C$, each current of which is proportional to the corresponding maximum (excess) current noted above.

However, in an actual system having parallel power sources, the ratio of current flowing to the DUT from one power source and other power source will vary depending on various factors including differences in internal impedances and output voltages between power sources. Thus, there can be a DPS that drains the excess current and generates an excess current detection signal even though the overall current to the device under test has not reached its excess current. In such a situation, one DPS flows the excess current while the other DPS flows a current lower than its excess current, which results in an inconsistent judgement on the device testing. There even can be a DPS which flows an electric current in a direction opposite to the currents of the other DPSs.

FIG. 6 shows a timing chart depicting the situation associated with the DPS in which an excess electrical current is applied to the device under test. First, when the electric current from the DPS 11A becomes an excess current situation at time t0, the DPS 11A generates an interrupt signal (excess current detection signal) toward a central processor (CPU) 13. In receiving the interrupt signal, the CPU 13 generates an interrupt mask signal (FIG. 6E) during which the other jobs are postponed and reads the conditions of the DPS 11A as well as other DPSs 11B and 11C which are connected in a parallel manner, through an interface (I/O) bus of FIG. 5.

In the case of FIG. 6, the DPSs 11A and 11C are conceived as operating at the predetermined excess currents while the DPS 11B is conceived as operating below the predetermined excess current (11A=NG, 11B=OK, 11C=NG in FIG. 6F). Therefore, the CPU 13 will determine that it is not under the excess current situation as a whole (FIG. 6G), since not all of the DPSs are in the excess current situation. As shown in FIG. 6F, CPU 13 requires the processing time to sequentially determine the situation of the DPSs 11A–11C.

When the above described interrupt job is completed, the CPU 13 resets the interrupt mask signal at time t2 as shown in FIG. 6E. When the intercept mask signal is reset, over current signals (intercept signals) are still generated by DPS 11B and DPS 11C immediately after the time t2. The CPU 13 immediately starts an intercept process and reads the situations of DPS 11A, DPS 11B and DPS 11C which are connected in parallel through the I/O bus. The CPU 13 will conceive that DPS 11A and DPS 11B are in the predetermined excess current condition. However, the CPU 13 will conceive that DPS 11C is under a normal condition flowing the current lower than the predetermined excess current because at the time of reading the situation of DPS 11C, the current of the DPS 11C has returned to normal.

Hence, in the example of FIG. 6, the CPU 13 will determine that the device power source as a whole is not in the situation of excess electric current even though the DUT is under the over current situation during the period between the times t2 and t3. As noted above, in the conventional power source system, there is a possibility of misjudgment in that the system determines that there is no excess electric current even though there is a situation of excess electric current in reality. In FIG. 6, after a time t3, it is shown that the conditions in the DUT electric source is "unknown". This means that excess electric current is not detected for the reason that the device is broken or returned to normal.

As noted above, in the conventional power source system, since the process time is needed for reading the condition of plurality of DPSs through the I/O bus after receiving the interrupt signal from one of the DPSs, there is a problem that the excess electric current may not be detected because of the timing mismatch in the power system. Conversely, even when there is no excess electric current situation, an over current signals may be initiated by one or more of the DPSs and the CPU is interrupted to be used for processing the interrupt job, which lowers the overall ability of the CPU in controlling the overall test procedure.

SUMMARY OF THE INVENTION

Therefore, it is an object of the present invention to provide an excess current detection and control circuit to be used in a semiconductor device test system which is capable of accurately detecting defects associated with an electric power source testing of a device under test.

It is another object of the present invention to provide an excess current detection and control circuit which is capable of improving the reliability in detecting an excess electric current from one of a plurality of power sources arranged in parallel with each other to provide an electric power source to a device under test.

It is a further object of the present invention to provide an excess current detection and control circuit which is capable of decreasing interrupt actions involving a power source system and hence improving an overall efficiency in testing a semiconductor device by a semiconductor device test system.

In order to achieve the above objectives, an excess electric current detect control circuit of the electric source in the present invention is arranged to generate an interrupt signal only when all of the device power sources flowing excess currents to a device to be tested. In the present invention, an excess current detection and control circuit for a power source system to provide an overall electric current to a device to be tested, includes:

a plurality of device power sources connected in parallel with each other to form the power source system, each of the device power sources supplying an electric current to the device to be tested to form the overall electric current, and each of the device power sources being provided with a predetermined excess current level flowing to the device to be tested and maintaining the excess current without further increasing the electric current level and generating an excess current detection signal when the electric current reaching the excess current level;

a power source condition monitor device connected to the plurality of device power sources for receiving the excess current detection signal from each of the device power sources, the power source condition monitor device generating an interruption signal only when receiving the excess current detection signal from each and all of the device power sources connected to the device to be tested; and a central processor unit for controlling an overall process of testing the device to be tested, the central processor unit determining whether the overall current flowing through the device under test exceeds a predetermined current level of the device under test when receiving the interruption signal from the power source condition monitor device.

In another aspect of the present invention, the excess current detection and control circuit is employed in testing a plurality of devices to effectively detect the excess current situation in either one of the devices. The excess current detection and control circuit for a power source system to provide an overall electric current to each of more than two devices to be tested, includes:

at least two sets of a plurality of device power sources connected in parallel with each other to supply the overall electric current to the devices to be tested, each of the device power sources in each of the sets supplying an electric current to a corresponding one of the devices to be tested to form the overall electric current, and each of the device power sources being provided with a predetermined excess current level flowing to the corresponding device to be tested and maintaining the excess current without further increasing the electric current level and generating an excess current detection signal when the electric current reaching the excess current level;

a power source condition monitor device connected to the sets of the plurality of device power sources for receiving the excess current detection signal from each of the device power sources, the power source condition monitor device generating an interruption signal only when receiving the excess current detection signal from each and all of the device power sources in one of the sets connected to the corresponding device to be tested;

a central processor unit for controlling an overall process of testing the devices to be tested, the central processor unit determining whether the overall current flowing through each of the devices under test exceeds a predetermined current level of corresponding one of the devices under test when receiving the interruption signal from the power source condition monitor device.

According to the present invention, the power source condition monitor device provides an interruption signal to the central processor unit only when all of the device power sources turn to the excess current states. The central processor unit is not required to inspect each power source connected to a device under test when receiving an excess current detection signal. The central processor unit is interrupted only a short period of time to determine that the device under test drains the excess current.

Thus, unlike the conventional system which requires a process time for inspecting all of the power sources, the excess current detection and control circuit of the present invention can accurately detect the excess current of the device since the states of the power sources or the device under test will not change during such a short period of time. Further, since the central processor unit is interrupted only a short period of time, the ability of the central processor unit in controlling an overall operation of the test system is not affected.

BRIEF DESCRIPTION OF THE DRAWINGS

FIG. 1 is a block diagram showing an embodiment of excess current detection and control circuit in accordance with the present invention.

FIGS. 2A–F are timing diagrams showing an operation of the embodiment of excess current detection and control circuit of FIG. 1.

FIGS. 4A–J are timing diagrams showing the case where there are two devices to be tested in the present invention shown in FIG. 3.

FIG. 5 is a block diagram showing a circuit structure of a conventional excess electric current detection and control circuit.

FIGS. 6A–G are timing diagrams showing an operation of the conventional circuit of FIG. 5.

DETAILED DESCRIPTION OF THE PREFERRED EMBODIMENT

Figure 3:
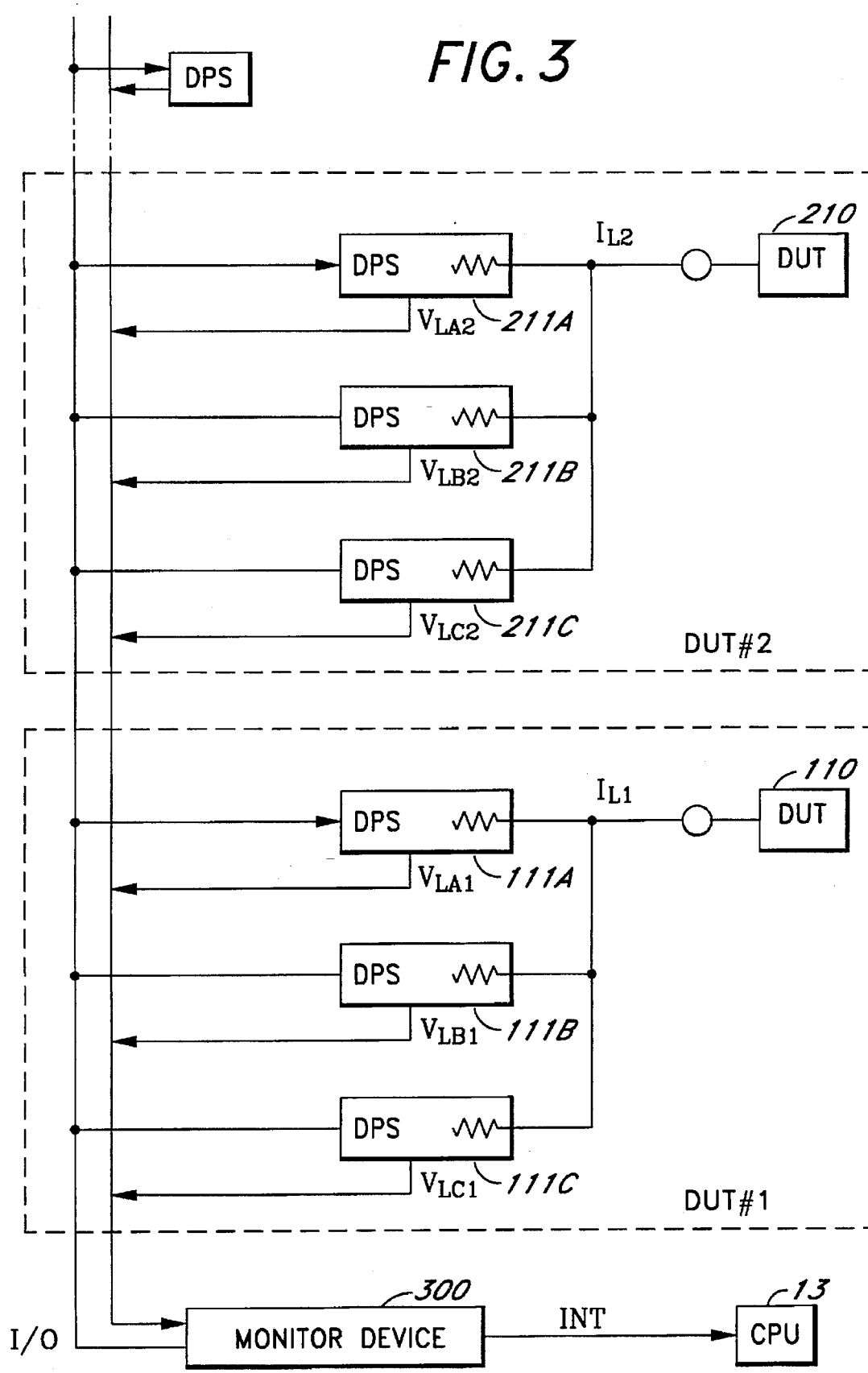
FIG. 3 is a block diagram showing the case where there are two devices to be tested in the present invention.

FIG. 1 shows an example of excess electric current detection and control circuit of the present invention. In this circuit, a power source condition monitor device 12 which constantly monitors conditions of all the device power sources (DPSs), is provided between DPSs and a central processor unit (CPU) 13. In the power source condition monitor device 12, information regarding the combinations of DPSs connected to a device under test (DUT) 10 including an excess (maximum) current of each DPS are stored in a memory. CPU 13 controls such an excess current level of each DPS through an interface (I/O) bus via the power source condition monitor device 12. When all the DPS connected to DUT 10 are turned to the excess electric currents, an interruption toward the CPU 13 actions is initiated by the power source condition monitor device 12 to notify that an excess electric current is drained to the DUT 10.

In FIG. 1, when the excess electric current of DUT 10 is set to $I_{Lmax}$, corresponding excess electric currents $I_{Amax}$, $I_{Bmax}$ and $I_{Cmax}$ are respectively set in the DPSs 11A, 11B and 11C depending on the capacity of each DPS so as to satisfy $I_{Lmax}=I_{Amax}+I_{Bmax}+I_{Cmax}$. This relationship is stored in the memory in the power source condition monitor device 12. In the normal situation, as shown in FIG. 1, the electric current $I_L$ to be provided to DUT should be $I_L=I_A+I_B+I_C$ each current of which is proportional to the corresponding excess (maximum) current noted above.

When the DPS reaches its excess current, for example because of a defect in DUT 10, the DPS maintains the excess current without further increasing the current flow therefrom even though DUT 10 requires more electric current. At the same time, the DPS generates an excess current detection signal $V_L$ to the power source condition monitor device 12. The power source condition monitor device 12 provides an interruption signal to the CPU 13 only when all of the excess current detection signals $V_{LA}$, $V_{LB}$ and $V_{LC}$ have been generated by the DPSs 11A, 11B and 11c, respectively.

FIG. 2 shows a timing diagram showing an operation of the excess current detection and control circuit including the power source condition monitor device 12 of the present invention. In this case, even when DUT 10 is under the normal situation, DPS 11A becomes its excess current state in an earlier time than the others (FIGS. 2A and 2B) and provides the excess current detection signal $V_{LA}$ to the power source condition monitor device 12. However, the monitor device 12 does not generate an interrupt signal under this condition as shown in FIG. 2E.

At the time when all of the DPSs 11A–11C are forced to flow the excess currents, the excess current detection signals $V_{LA}$, $V_{LB}$ and $V_{LC}$ are received by the power source condition monitor device 12 which generates an interrupt signal as shown in FIG. 2E. CPU 13 receives the interrupt signal from the monitor device 12 and determines that DUT 10 drains the excess electric current (FIG. 2F). In this manner, CPU 13 can accurately determine whether the device under test is defective in its power supply test by one interruption action. CPU 13 is interrupted only a short period of time and is not required to check each state of the device power sources one by one.

FIG. 3 shows an example of situation where two devices under test DUT 110 and 210, are respectively supplied with power source currents from the excess current detection and control circuits of the present invention. In this example also, a power source condition monitor device 300, which constantly monitor the conditions of all DPSs, is provided between all of the DPSs and CPU 13. In the power source condition monitor 300, information regarding the combinations of DPSs 111A–111C connected to DUT 110 including, an excess current of each DPS are stored in a memory. Also, information regarding the of DPSs 211A–211C connected to DUT 210 including an excess current of each DPS are stored in the memory.

DPSs 111A–111C and 211A–211C generate excess current detection signals $V_{LA1}$–$V_{LC1}$ and $V_{LA2}$–$V_{LC2}$, respectively as shown in FIG. 3, when the electric current flowing from the corresponding DPS reaches the predetermined excess current. The DPS maintains the excess current without further increasing the amount of current flowing therefrom. The power source condition monitor system 300 generates an interruption signal to CPU 13 when either all of DPSs connected to DUT 110 or all of DPSs connected to DUT 210 generate the excess current detection signals. In receiving the interruption signal, CPU 13 postpones the current job and determines that the DUT drains the excess electric current and thus it is defective.

FIG. 4 shows a timing diagram showing the operation of the power source system of FIG. 3 wherein two devices under test DUTs 110 and 210 are supplied with electric currents from the corresponding sets of power sources connected in parallel with each other. In this example, the current following through DUT 110 remains the normal state while the current following through DUT changes from the normal state to the excess current state (Figures A and E).

Even though the current flowing to DUT 110 is below the excess current, DPS 111A and DPS 111B have become the excess current states and generate the excess current detection signals $V_{LA1}$ and $V_{LB1}$ as shown in FIGS. 4B and 4C. However, since the electric current from DPS 111C remains below the excess current, an excess current detection signal from DPS 111C is not received by the power source condition monitor device 12 (FIG. 4D). Thus, the power source condition monitor device 12 will not initiate an interruption signal.

When DUT 210 turns to the excess current situation, all of the DPSs 211A, 211B and 211C generate the excess current detection signals $V_{LA2}$, $V_{LB2}$ and $V_{LC2}$ as shown in FIGS. 4F, 4G and 4H. In receiving the excess current signals from all of the DPSs 211A, 211B and 211C connected to DUT 210, the power source condition monitor device 12 provides an interrupt signal of FIG. 4I to CPU 13 which determines that DUT 210 in the excess current situation as shown in FIG. 4J.

As has been described, according to the present invention, the power source condition monitor device provides an interruption signal to the central processor unit only when all of the device power sources turn to the excess current states. The central processor unit is not required to inspect each power source connected to a device under test when receiving an excess current detection signal. The central processor unit is interrupted only a short period of time to determine that the device under test drains the excess current.

Thus, unlike the conventional system which requires a process time for inspecting all of the power sources, the excess current detection and control circuit of the present invention can accurately detect the excess current of the device since the states of the power sources or the device under test will not change during such a short period of time. Further, since the central processor unit is interrupted only a short period of time, the ability of the central processor unit in controlling overall operation of the test system is not affected.

What is claimed is:

1. An excess current detection and control circuit for a power source system to provide an overall electric current to a device to be tested, comprising:

a plurality of device power sources connected in parallel with each other to form said power source system, each of said device power sources supplying an electric current to said device to be tested to form said overall electric current, and each of said device power sources being provided with a predetermined excess current level flowing to said device to be tested and maintaining said excess current without further increasing said electric current level and generating an excess current detection signal when said electric current reaching said excess current level;

a power source condition monitor device connected to said plurality of device power sources for receiving said excess current detection signal from each of said device power sources, said power source condition monitor device generating an interruption signal only when receiving said excess current detection signal from each and all of the device power sources connected to said device to be tested;

a central processor unit for controlling an overall process of testing said device to be tested, said central processor unit determining whether said overall electric current flowing through said device being larger than a predetermined maximum current level of said device when receiving said interruption signal from said power source condition monitor device.

2. An excess current detection and control circuit as defined in claim 1, wherein said power source condition monitor device is provided with information on said excess current level of each of said device power sources connected in parallel to supply said overall current to said device to be tested.

3. An excess current detection and control circuit for a power source system to provide an overall electric current to each of two devices to be tested, comprising:

two sets of a plurality of device power sources connected in parallel with each other to supply said overall electric current to said devices to be tested, each of said device power sources in each of said sets supplying an electric current to a corresponding one of said devices to be tested to form said overall electric current, and each of said device power sources being provided with a predetermined excess current level flowing to said corresponding device to be tested and maintaining said excess current without further increasing said electric current level and generating an excess current detection signal when said electric current reaching said excess current level;

a power source condition monitor device connected to said sets of said plurality of device power sources for receiving said excess current detection signal from each of said device power sources, said power source condition monitor device generating an interruption signal only when receiving said excess current detection signal from each and all of the device power sources in one of said sets connected to said corresponding device to be tested;

a central processor unit for controlling an overall process of testing said devices to be tested, said central processor unit determining whether said overall electric current flowing through each of said devices being larger than a predetermined maximum current level of corresponding one of said devices when receiving said interruption signal from said power source condition monitor device.

* * * * *